United States Patent [19]

Milkovic

[11] 4,066,960
[45] Jan. 3, 1978

[54] ELECTRONIC KILOWATT-HOUR-METER WITH ERROR CORRECTION

[75] Inventor: Miran Milkovic, Scotia, N.Y.

[73] Assignee: General Electric Company, Schenectady, N.Y.

[21] Appl. No.: 755,298

[22] Filed: Dec. 29, 1976

[51] Int. Cl.² ............................................. G01R 21/06
[52] U.S. Cl. .................................... 324/142; 364/483
[58] Field of Search ................ 324/142, 141; 235/194; 307/225; 328/160

[56] References Cited

U.S. PATENT DOCUMENTS

| Re. 29,079 | 12/1976 | Gilbert | 324/142 X |
| 3,975,682 | 8/1976 | Mayfield | 324/142 |

Primary Examiner—Stanley T. Krawczewicz
Attorney, Agent, or Firm—Robert E. Brunson; Philip L. Schlamp

[57] ABSTRACT

An electronic kilowatt-hour meter having internal error correction is disclosed for metering electrical power and energy consumption in a single phase or polyphase electrical system. A comparator compares an analog signal which is proportional to the voltage in the system with a relatively high frequency triangular waveform. The output of the comparator which is a pulse width modulated signal having a pulse duration proportional to the amplitude of the voltage in the system is multiplied by a signal which is proportional to the current in a system. The output of the multiplier is integrated to thereby provide a signal which is proportional to the energy consumed in the system. The output of the integrator is converted to a pulse train having a frequency which is proportional to the amplitude of the output signal of the integrator, and hence is proportional to the kilowatt hours consumed in the electrical system. In order to provide error correction, the phase of the analog signal which is proportional to the voltage in the system is shifted with respect to the phase of the triangular waveform by reversing the connections of these respective signals to the input terminals of the comparator. This is done each time an output pulse is generated by the analog-to-pulse-rate converter. Thus the integrator alternately integrates up and down to thereby correct any offset errors in the system.

7 Claims, 2 Drawing Figures

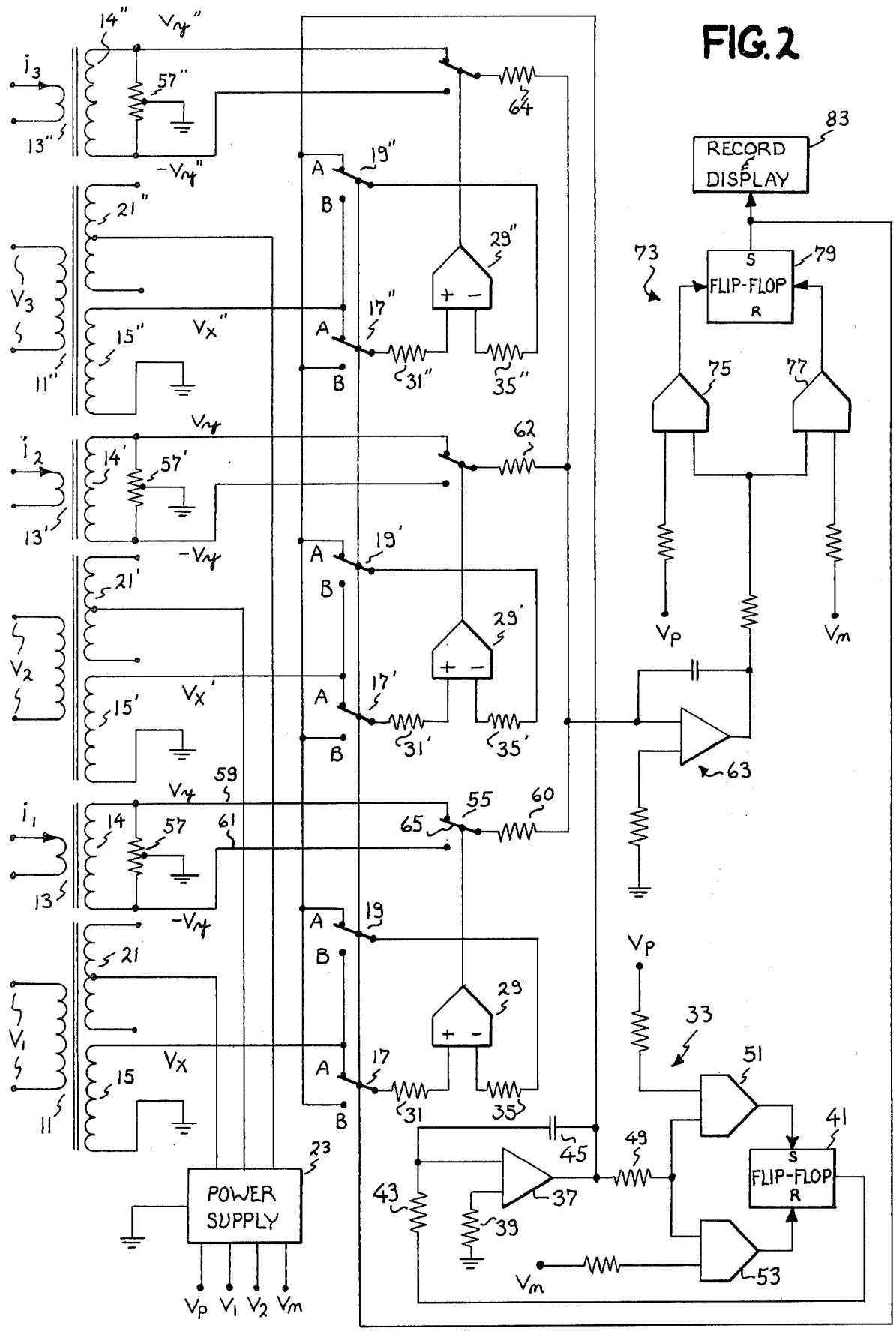

ELECTRONIC KILOWATT-HOUR-METER WITH ERROR CORRECTION

BACKGROUND OF THE INVENTION

The present invention relates to an electronic kilowatt hour meter having an improved means for correcting error in the meter.

This invention relates to the metering of electrical energy in terms of, for example, kilowatt hours in an electrical system. Electrical energy in terms of kilowatt hours or kWh has been and continues to be metered with the rotating disc type of meter which is disclosed in, among other sources, the "Electrical Meterman's Handbook", Chapter 7, 7th Edition, published 1965 by the Edison Electric Institute. The invention hereinafter disclosed represents a departure from the methodology and apparatus exemplified by the rotating disc type meter. In addition, those who are familiar with the instrumentation and metering arts respecting electrical power and energy know of proposed systems including apparatus employing electronic and solid state devices for measuring power and energy. An example of such a system is disclosed in Milkovic U.S. Pat. No. 3,951,138 assigned to the common assignee herewith. In such apparatus, the electronic and solid state devices replace the conventional rotating disc. Thus, in prior art systems, the current flowing through a line and the voltage across a load impedance connected to the line are each detected, and signals representing these parameters are coupled to a pulse width amplitude multiplier. The multiplier generates an output signal which is proportional to the product of the detected current and voltage. This signal is then averaged by means of a low-pass filter to provide a DC voltage having an amplitude which is proportional to the total average power of the electrical system. This DC voltage is converted to a pulse train by means of an analog-to-pulse-rate converter, which pulse train has a variable signal repetition rate $f$ which is proportional to the average power in the system, with each output pulse signal representing a constant quantized amount of electrical energy. The output pulse train is then coupled to a display mechanism which may, for example, include a counter or register which performs conventional accumulation, storage and display functions. An example of one such kilowatt hour meter was disclosed in Milkovic U.S. patent application Ser. No. 505,798, now U.S. Pat. No. 3,961,257. None of these electronic prior art metering systems has an internal error correcting means for correcting an offset error within the meter.

It accordingly is an object of this invention to provide a method and apparatus for metering kilowatt hours in a single or polyphase AC electrical system.

It is another object of this invention to provide a method and apparatus for metering kilowatt hours in a single or polyphase AC electrical system wherein error correction is provided in the meter.

SHORT STATEMENT OF THE INVENTION

Accordingly, this invention relates to a method and apparatus for metering kilowatt hours in an AC electrical system wherein the apparatus includes an error detector. The apparatus includes a comparator and a triangular waveform generator. The triangular waveform generator generates a high frequency signal which is coupled to one input of the comparator. An analog signal proportional to the detected voltage in the electrical system is connected to the other input terminal of the comparator. The output of the comparator is thus a pulse width modulated signal wherein the pulse width is proportional to the magnitude of the voltage in the electrical system. This signal is multiplied by a signal which is proportional to the amplitude of the current in the system. Thus, the output of the multiplier is proportional to the in-phase product of the current and voltage in the electrical system. This signal is integrated to derive a signal which is proportional to the kilowatt hours in the system. The integrated signal is then converted to a pulse train wherein the frequency of the pulse train is proportional to the rate at which kilowatt hours are consumed in the electrical system. In order to provide error correction, a switching means is provided for reversing the input terminals to which the triangular and analog voltage proportional signals are coupled. The switch is operated each time an output pulse occurs in the pulse train at the output of the meter. Thus, the integrator tends to integrate upwardly and downwardly in alternate cycles as the pulses in the pulse train are generated. This effectively nullifies offset error generated during the integration process.

In an alternate embodiment of the invention a polyphase metering system is provided wherein a plurality of comparators are provided with a plurality of multipliers connected to the output thereof. The resulting output signals from each of the multipliers is summed and integrated to derive a signal which is proportional to the sum of the kilowatt hours consumed in each phase of the polyphase system.

BRIEF DESCRIPTION OF THE DRAWINGS

Other objects, features and advantages of the present invention will become more fully apparent from the following detailed disclosure of the preferred embodiment, the appended claims and the accompanying drawings in which:

FIG. 2 is a schematic block diagram of a polyphase electronic kilowatt hour meter of the present invention.

DETAILED DESCRIPTION OF THE PREFERRED EMBODIMENT

Figure 1:
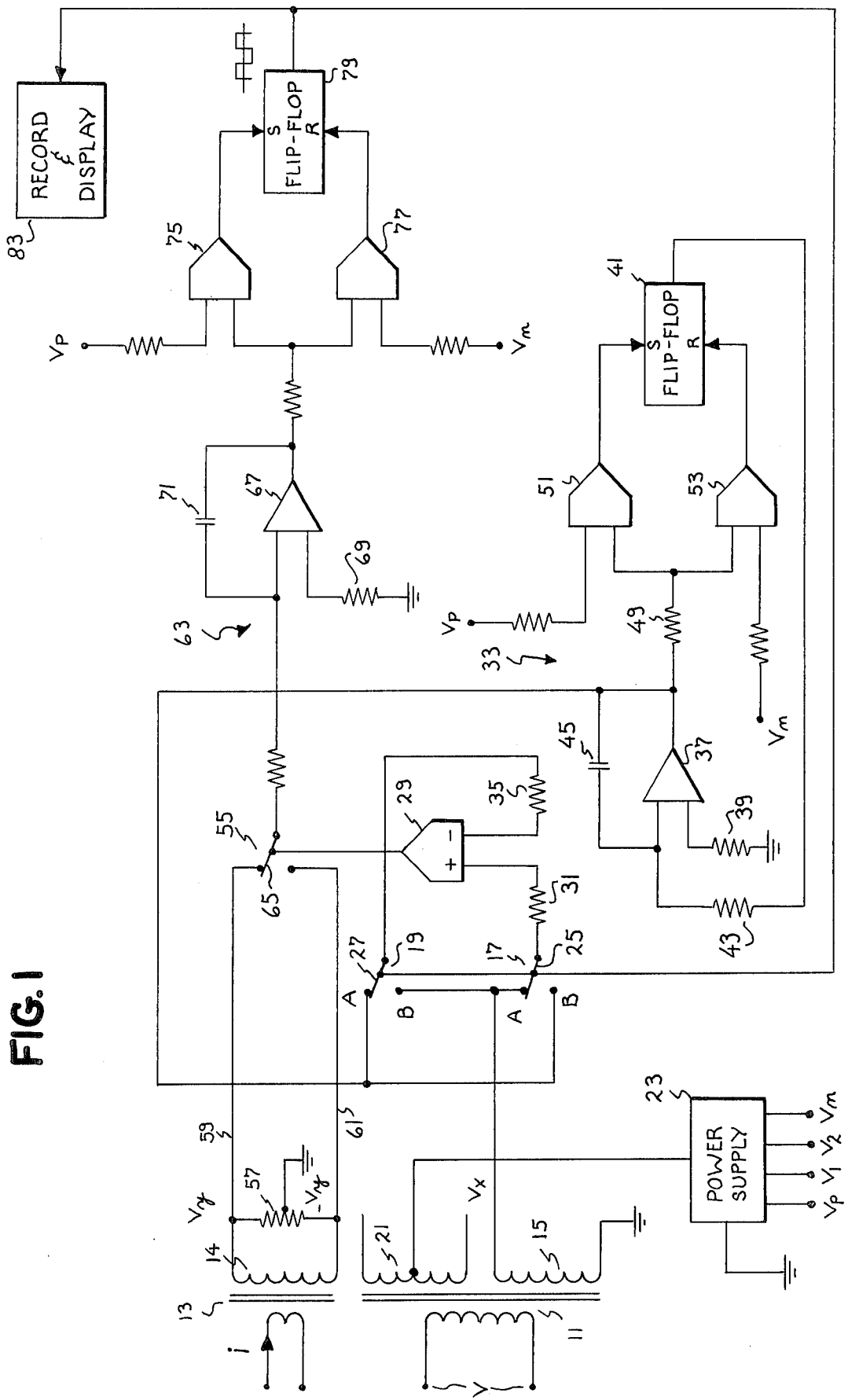
FIG. 1 is a schematic block diagram of a single-phase electronic kilowatt hour meter of the present invention.

Refer now to FIG. 1 where there is a schematic block diagram of one preferred embodiment of the present invention. The electrical system in which power and energy is being measured by the meter of the present invention may be of any type, including, for example, a conventional 60 Hz power distribution system. The voltage in the system is detected by means of a potential transformer 11. The current in the system is measured by means of a current transformer 13. The potential transformer 11 has a first secondary winding 15 across which is derived an analog signal $V_x$ which is proportional to the voltage V in the electrical system. This voltage is coupled to terminals A and B of switches 17 and 19, respectively. A secondary winding 21 of the transformer 11 drives a voltage which is coupled to a power supply unit 23. The power supply unit 23 includes a rectifier and filter and provides a plurality of outputs for driving the respective active circuit components of the present invention.

In the state illustrated in FIG. 1, the switch arm 25 of switch 17 is closed on terminal A, while the switch arm 27 of switch 19 is closed on terminal A. Thus, switch 17 couples the analog voltage $V_x$ to one input of comparator 29 via resistor 31. The other input to the comparator 29 is a relatively high frequency triangular waveform generated by triangular waveform generator 33 which signal is coupled to the comparator 29 via input resistor 35.

The triangular waveform generator 33 includes an integrator which comprises an amplifier 37 having the in-phase input thereto grounded via resistor 39 and having the inverted input connected to the output of flip-flop 41 via resistor 43. A feedback capacitor 45 is connected across the inverted input of the amplifier 37 and the output thereof to thereby provide a conventional integrator circuit. The output of the integrator is coupled to one input of the comparator 29 via resistor 35 and is also coupled to a pulse generating circuit 47 via resistor 49. The pulse generation circuit includes a first comparator 51 and a second comparator 53. The other input to the first comparator 51 is a fixed positive voltage $V_p$ and the other input to the comparator 53 is a constant negative voltage $V_n$. The outputs of the comparators 51 and 53 are connected to the set and reset inputs of flip-flop 41, respectively.

In operation, assume that the integrator is integrating upwardly in a positive direction, i.e., generating the positive going portion of the triangular waveform. When the output voltage of the integrator reaches the voltage level $V_p$, comparator 51 generates an output pulse to set the flip-flop 41. A pulse is thereby derived at the output of flip-flop 41 which causes the integrator to start integrating downwardly. As the integrator integrates downwardly, i.e., generates an output voltage which goes in a negative direction, the negative going portion of the triangular waveform is generated. When the integrator provides an output voltage which reaches the level $V_n$, a comparator 53 generates an output signal for resetting the flip-flop 41. When this occurs, the output of the flip-flop 37 is switched to thereby cause the integrator to integrate upwardly again. This cycle repeats itself at a fairly rapid rate compared to the frequency of the line voltage in the electrical system. As an example, in the preferred embodiment, the line voltage may be the conventional 60-cycle voltage provided in electrical distribution systems. In such a case, the triangular waveform generator 33 preferably generates a triangular waveform having a frequency of about 10 kHz.

Referring back to the comparator 29, the output of the comparator is a pulse train wherein each of the pulses has a time duration which is proportional to the instantaneous amplitude of the line voltage in the electrical system being measured. Thus, the output of the comparator 29 is a pulse width modulated signal having a duration which is proportional to the line voltage V. This signal is coupled to a switching circuit 55 which, as illustrated, is in mechanical form. However, it should be appreciated that the switch 55 can be a suitable electronic switching circuit of a suitable type well known in the art. The switch 55 serves as a multiplying device.

The secondary 14 of the current transformer 13 has a center tap resistor 57 connected thereacross. The center tap of the resistor 57 is connected to ground so that a first analog voltage $V_y$ is provided on line 59 and a second analog voltage $-V_y$ is provided on line 61. These voltages are proportional in magnitude to the current detected in the system but are 180° out-of-phase with respect to one another. The voltage $V_y$ has substantially the same phase as the current in the system. It can be seen that the switch 55 serves to connect either the voltage $V_y$ or $-V_y$ to the input of integrator circuit 63 depending upon the output of the comparator 29. As an example, when the output of the comparator 29 is high, switch arm 65 of switch 55 is closed on line 61; whereas when the output of comparator 29 is low, the switch arm 65 is closed on line 59.

The integrator 63 is of conventional design and includes an amplifier 67 having the in-phase terminal thereof connected to ground via resistor 69 and, in addition, includes a feedback capacitor 71. The input to the integrator 63 is a chopped analog signal having an instantaneous amplitude which is proportional to the current measured in the electrical system with the duration of the chopped portion of the waveform being proportional to the magnitude of the voltage in the system. Thus, the input voltage to the integrator 63 is proportional to the power being consumed in the electrical system. The output of the integrator is a signal which is proportional to the energy being consumed in the electrical system. This signal is converted to a pulse train by means of a pulse generating circuit 73. The pulse generator 73 is somewhat similar to the pulse generator 47 in the triangular waveform generator 33. Thus, the pulse generator includes comparators 75 and 77 and a flip-flop circuit 79. The output of the integrator is coupled to each of the comparators 75 and 77 via resistor 81. A constant positive voltage $V_p$ is coupled to the other input of comparator 75 and a constant negative voltage $V_n$ is coupled to the other input of comparator 77. The output of comparator 75 is connected to the set input of the flip-flop 79 and the output of comparator 77 is coupled to the reset input of comparator 79.

In operation, assume the integrator 63 is integrating in a positive direction. When the voltage at the output of the integrator equals $V_p$, the comparator 75 provides an output signal for setting the flip-flop 79. A pulse is thus generated which is coupled to a recording and display device 83 which is of conventional design known in the art. At the same time, the output pulse is coupled back to switches 17 and 19 to thereby cause the switch arms 25 and 27, respectively, to close on contacts B. This reverses the input connections to the comparator 29 so that now the triangular waveform is connected to the in-phase input of the comparator and the analog voltage $V_x$ is coupled to the out-of-phase input terminal thereof. Thus, a predominantly positive going signal is provided at the input of the integrator 63 and, hence, the integrator begins to integrate in a negative going direction. As the output of the integrator decreases to the negative voltage level $V_n$, comparator 77 provides an output pulse for resetting the flip-flop 79. This results in an output which re-establishes contact arms 25 and 27 of switches 17 and 19, respectively, in contact with terminals A. The cycle then repeats itself. Thus, during the up-and-down integration process, the error signals due to offset voltages resulting from the integration process are averaged out. This improves the dynamic range of the electronic kilowatt meter of the present invention.

Refer now to FIG. 2 where there is disclosed a polyphase kilowatt metering system. More specifically, the metering system of FIG. 2 is designed to measure power in a three-phase system. The kilowatt-hour meter includes three potential transformers 11, 11' and 11", and three current transformers 13, 13' and 13" for detecting the voltage and current in each of the three phases of the polyphase system. As in the case of the embodiment of FIG. 1, each potential transformer includes a secondary winding 15, 15' and 15" grounded at one end and connected to terminal A of switches 17, 17' and 17" and terminal B of switches 19, 19' and 19", respectively, at the other end. In addition, each potential transformer includes a second secondary winding 21, the output of which is coupled to a power source 23. The voltage derived from the secondary windings 21 are summed, rectified and filtered to provide a plurality of DC output voltages for driving the active circuit elements in the metering system.

The current transformers each include a secondary winding 14, 14' and 14" with each having a resistor 57, 57' and 57", respectively, connected thereacross. The resistor is center tapped with the center tap being grounded so that two analog signals $V_y$ and $-V_y$ are provided on lines 59 and 61, respectively. These signals are proportional to the current detected in the particular phase of the polyphase system, but the voltage $V_y$ is 180° out-of-phase with respect to the voltage $-V_y$.

The switches 17 and 19 (hereafter, identical circuit element in each phase will be identified without primes) couple input voltages to the comparators 29. Thus, switch 17, when in the position shown, couples the analog volgage $V_x$ to the in-phase input of the comparator 29 via resistor 31, while switch 19 couples a triangular waveform to the out-of-phase input terminal of the comparator 29 via a resistor 35. The triangular waveform generator 33 is of the same design as that illustrated in FIG. 1 and, accordingly, would not be described herein in detail. It suffices to say that the triangular waveform generated by the triangular waveform generator 33 has a frequency which is large compared to the frequency of the electrical energy in the polyphase electrical system being measured.

The outputs of the comparators 29 pulse width modulated signals having a pulse width which is proportional to the amplitude of the analog voltage $V_x$ and, accordingly, is proportional to the amplitude of the voltage in the particular phase being measured in the electrical system. This signal is coupled to a multiplier switch 55 which is illustrated in mechanical form. It should be appreciated that the switch 55 may be of an electronic type of suitable design known in the art. In response to the output of the comparator 29, the switch arm 65 of the switch 55 is rotated into contact with lines 59 or 61 depending upon whether the output of the comparator is high or low. Thus, the output of switch 55 is coupled to integrator circuit 63 by means of a first summing resistor 60. The output of switch 55' is coupled to the integrator 63 via a second summing resistor 62, and the output of switch 55" is coupled to the integrator circuit 63 via a third summing resistor 64. The outputs of each of the switches 55, 55' and 55" is a chopped analog signal having an amplitude which is proportional to the instantaneous current in the respective phases of the polyphase system with the duration of the chopped waveform being proportional to the magnitude of the voltage in the respective phase of the system. These signals are summed and coupled to the integrator 63 with the summation signal being proportional to the total power being consumed in the polyphase system. The output of the integrator 63 is a voltage which is proportional to the energy consumed in the polyphase system. This voltage is coupled to a pulse generator 73 which is of the same design as the pulse generator 73 of FIG. 1. Accordingly, the operation of this circuit will not be described herein in detail. The output of the generator 73 is a pulse train which is coupled to a record and display device 83 which accumulates the pulses and provides a recording and display thereof in terms of kilowatt hours of energy consumed. The output of the generator 73 is also coupled back to drive the switch arms of the switches 17, 17', 17", 19, 19' and 19" for the purpose of correcting offset error generated during the integrating step. Thus, when the switch arms are in the position illustrated, the average output of the switches 55, 55' and 55" is negative and, hence, the integrator 63 tends to integrate in the positive direction. Thus, the integrator integrates down until the output voltage thereof equals $V_n$ at which time an output pulse is provided for switching the contact arms of the aforementioned switches 17-19" into contact with terminals B. When this occurs, the triangular waveform voltage is coupled to the in-phase input terminals of the comparators 29, while the analog voltages $V_x$ are coupled to the outer phase input terminals of the comparator 29. This results in the average output of the switches 55, 55' and 55" being negative and, hence, the integrator 63 integrates in a positive direction. When the output voltage of integrator 63 equals $V_p$, flip-flop 79 provides an output pulse which switches the switch arms of the switches 17-19" back in contact with terminals A. It can be thereby seen that during the up/down integration, the error signals of the integrator are averaged out. This, as aforementioned, improves the dynamic range of the electronic kilowatt meter of the present invention and permits a relatively simplified circuit arrangement for measuring both power and energy in a polyphase system.

While the present invention has been disclosed in connection with preferred embodiments thereof, it should be appreciated that there may be other alternate embodiments of the invention which fall within the spirit and scope thereof as defined by the appended claims.

What is claimed is:

1. An electronic meter for measuring energy consumed in an electrical system comprising:

means for generating first and second analog signals, said signals being proportional to a current in said system, and said first analog signal being 180° out-of-phase with respect to said second analog signal, means for generating a third analog voltage proportional to a voltage in said system, means for generating a relatively high frequency triangular waveform signal, a comparator having an in-phase input and an inverting input, switching means for selectively coupling said triangular waveform to one input of said comparator and said third analog signal to the other input of said comparator, the output of said comparator being a pulse width modulated signal having a pulse width proportional to the amplitude of the third analog signal, means for multiplying said pulse width modulated output signal of said comparator with a signal proportional to said first and second current proportional analog signals, the output of said multiplier having an amplitude proportional to the electrical current in said system and having a pulse width proportional to the amplitude of the voltage in said system, an integrator, said integrator being connected to the output of said multiplier, the output of said integrator being proportional to the energy consumed in said system, a pulse generator, the input of said generator being connected to said integrator to thereby convert the output of said integrator to a pulse train, each pulse being proportional to energy consumed in said system, means connected to said pulse generator for recording and displaying the energy consumed in said electrical system, and error correction means responsive to the output pulses of said generator for operating said switching means to reverse the input terminals of said comparator to which said triangular waveform signal and said third analog signal are connected to thereby correct offset integration errors in said meter.

2. The electronic meter of claim 1 wherein said pulse generator circuit comprises means for determining when the voltage level at the output of said integrator reaches a first predetermined positive level and means for detecting when the output of said integrator reaches a second negative level, and means responsive to said detecting means for generating an output pulse when said predetermined positive and negative levels are reached.

3. The meter of claim 2 wherein said multiplying means comprises a switch, said switch selectively connecting said first or said second analog signals to said integrator in accordance with the output of said comparator.

4. An electronic meter for measuring energy consumed in a polyphase electrical system comprising:

a plurality of means for generating first and second analog signals, said signals being proportional to the current in each phase of said system wherein said first analog signal is 180° out-of-phase with respect to said second analog signal, a plurality of means for generating a third analog voltage proportional to the voltage in each phase of said system, means for generating a relatively high frequency triangular waveform signal, a plurality of comparators, one for each phase of said polyphase system, a plurality of switching means for selectively coupling said triangular waveform signal to one input of each of said comparators, and one of third analog signals to the other input of said comparator, the output of said comparators being a pulse width modulated signals wherein each signal has a pulse width proportional to the amplitude of the third analog signal coupled to the input of the comparator generating the pulse width modulated signal, a plurality of means for multiplying said pulse width modulated output signals of said comparators with the corresponding first and second current proportional analog signals for each phase, the output of said multipliers having an amplitude proportional to the amplitude of said electrical current in said system and having a pulse width proportional to the amplitude of the electrical voltage in said system, means for summing said output of said multiplying means, an integrator, said integrator being connected to the outputs of said multipliers, the output of said integrator being proportional to the energy consumed in said system, a pulse generating circuit, the input of said generator being connected to said integrator to thereby convert the output of said integrator to a pulse train, each pulse being proportional to energy consumed in said system, means connected to said generator for recording and displaying the energy consumed in said electrical system, and error correction means responsive to the output pulses of said generator for operating said plurality of switching means to reverse the input terminals of said comparators to which said triangular waveform signal and said third analog signal are connected.

5. The electronic meter of claim 4 wherein said pulse generating circuit comprises means for determining when the voltage level at the output of said integrator reaches a first predetermined positive level and means for detecting when the output of said integrator reaches a second negative level, and means responsive to said detecting means for generating an output pulse when said predetermined positive and negative levels are reached.

6. The meter of claim 5 wherein said multiplying means each comprises a switch, said switch selectively connecting said first or said second analog signals to said integrator in accordance with the output of said comparator.

7. An electronic meter for measuring energy consumed in an electrical system comprising:

means for generating first and second analog signals, said signals being proportional to current in said system, and said first analog signal being 180° out-of-phase with respect to said second analog signal, means for generating a third analog voltage proportional to the voltage in said system, means for generating a relatively high frequency triangular waveform signal, a comparator, said comparator having an in-phase input terminal and a phase inverting input terminal, switching means for selectively coupling said triangular waveform signal to one input of said comparator and said third analog signal to the other input of said comparator, means for multiplying said pulse width modulated output signal of said comparator with said first and second current proportional analog signals, the output of said multiplier having an amplitude proportional to the current in said system and having a pulse width proportional to the amplitude of the voltage in said system, an integrator, said integrator being connected to the output of said multiplier, the output of said integrator being proportional to the energy consumed in said system, a pulse generating circuit, the output of said generator being connected to said integrator to thereby convert the output of said integrator to a pulse train having each pulse proportional to energy consumed in said system, said pulse generator including means for determining when the voltage level at the output of said integrator reaches a first predetermined positive level, and means for detecting when the output of said integrator reaches a second negative level, and means responsive to said detecting means for generating an output pulse when said predetermined positive and negative levels are reached, and error correction means responsive to the output pulses of said pulse generating circuit for operating said switching means to reverse the input terminals of said pulse generating circuit to which said triangular waveform signal and said third analog signal are connected, said error correcting means correcting the offset integration errors in said meter, and means for deriving a voltage proportional to the voltage in said electrical system, means responsive to said derived voltage for generating power supply voltages for the comparator, the triangular waveform signal generating means, the switching means, the multiplying means, the integrator and the pulse generating circuit.

* * * * *